US009646879B2

(12) United States Patent
Kakimoto et al.

(10) Patent No.: US 9,646,879 B2
(45) Date of Patent: May 9, 2017

(54) DEPRESSION FILLING METHOD AND PROCESSING APPARATUS

(71) Applicant: TOKYO ELECTRON LIMITED, Tokyo (JP)

(72) Inventors: Akinobu Kakimoto, Nirasaki (JP); Youichirou Chiba, Nirasaki (JP); Takumi Yamada, Nirasaki (JP); Daisuke Suzuki, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 83 days.

(21) Appl. No.: 14/582,243

(22) Filed: Dec. 24, 2014

(65) Prior Publication Data

US 2015/0187643 A1 Jul. 2, 2015

(30) Foreign Application Priority Data

Dec. 27, 2013 (JP) ................................. 2013-270893

(51) Int. Cl.
*H01L 21/768* (2006.01)
*H01L 21/285* (2006.01)
(Continued)

(52) U.S. Cl.
CPC ........ *H01L 21/76877* (2013.01); *C30B 1/023* (2013.01); *C30B 29/06* (2013.01);
(Continued)

(58) Field of Classification Search
CPC ................................................ H01L 21/28531
See application file for complete search history.

(56) References Cited

U.S. PATENT DOCUMENTS

2005/0221547 A1* 10/2005 Yamauchi ....... H01L 21/823487 438/172
2007/0022941 A1* 2/2007 Park ....................... C30B 29/06 117/3

(Continued)

FOREIGN PATENT DOCUMENTS

JP 05-234900 A 9/1993
JP 08-172173 A 7/1996

(Continued)

*Primary Examiner* — Shaun Campbell
*Assistant Examiner* — Aaron Dehne
(74) *Attorney, Agent, or Firm* — Nath, Goldberg & Meyer; Jerald L. Meyer

(57) ABSTRACT

A depression filling method for filling a depression of a workpiece including a semiconductor substrate and an insulating film formed on the semiconductor substrate includes: forming an impurity-doped first semiconductor layer along a wall surface which defines the depression; forming, on the first semiconductor layer, a second semiconductor layer which is lower in impurity concentration than the first semiconductor layer and which is smaller in thickness than the first semiconductor layer; annealing the workpiece to form an epitaxial region at the bottom of the depression corresponding to crystals of the semiconductor substrate from the first semiconductor layer and the second semiconductor layer; and etching the first amorphous semiconductor region and the second amorphous semiconductor region.

4 Claims, 6 Drawing Sheets

W
E2
E1
EP
E2
E1
EP
IS
SB

(51) Int. Cl.

| | |
|---|---|
| ***C30B 1/02*** | (2006.01) |
| ***C30B 29/06*** | (2006.01) |
| ***H01L 21/67*** | (2006.01) |
| *H01L 21/02* | (2006.01) |
| *C30B 25/00* | (2006.01) |

(52) U.S. Cl.

CPC .. *H01L 21/28525* (2013.01); *H01L 21/28531* (2013.01); *H01L 21/67109* (2013.01); *H01L 21/76879* (2013.01); *C30B 25/00* (2013.01); *H01L 21/02667* (2013.01)

(56) References Cited

U.S. PATENT DOCUMENTS

| | | | | |
|---|---|---|---|---|
| 2011/0287629 | A1* | 11/2011 | Kakimoto | C23C 16/045<br>438/652 |
| 2012/0205775 | A1* | 8/2012 | Haeusler | H01L 21/76229<br>257/506 |

FOREIGN PATENT DOCUMENTS

| | | | |
|---|---|---|---|
| JP | 10-056154 | A | 2/1998 |
| JP | 2000-150830 | A | 5/2000 |
| JP | 2000-269462 | A | 9/2000 |
| JP | 2004-179451 | A | 6/2004 |
| JP | 2006-041276 | A | 2/2006 |

* cited by examiner 100
110
RAM
113
ROM
112
116
I/O port
114
CPU
115
Recipe storage unit
111
Valve control unit
126
Flow rate control unit
125
Heater controller
124
Manometer
123
Temperature sensor
122
Operation panel
121

DEPRESSION FILLING METHOD AND PROCESSING APPARATUS

CROSS-REFERENCE TO RELATED APPLICATION

This application claims the benefit of Japanese Patent Application No. 2013-270893, filed on Dec. 27, 2013, in the Japan Patent Office, the disclosure of which is incorporated herein in its entirety by reference.

TECHNICAL FIELD

The present disclosure relates to a depression filling method and a processing apparatus.

BACKGROUND

In the manufacture of a device such as a semiconductor device or the like, a process of filling silicon into a depression such as a through-hole or a contact hole formed on an insulating film is performed. The silicon filled into the depression can be used as, e.g., an electrode.

In a process of the related art, a polycrystalline silicon film is formed on a wall surface of a workpiece, which defines a depression. Subsequently, an amorphous silicon film is formed on the polycrystalline silicon film. Thereafter, the workpiece is annealed. In this process, by annealing the workpiece, amorphous silicon is moved toward the bottom portion of the depression, whereby the depression is filled with the amorphous silicon.

However, in the process mentioned above, when the amorphous silicon is moved by annealing toward the bottom portion of the depression, the amorphous silicon agglomerates. As a result, cavities called voids or seams are formed.

Under these circumstances, it becomes necessary to suppress the generation of cavities when filling a depression.

SUMMARY

Some embodiments of the present disclosure provide a depression filling method and a processing apparatus.

According to one embodiment of the present disclosure, there is provided a depression filling method for filling a depression of a workpiece including a semiconductor substrate and an insulating film formed on the semiconductor substrate, the depression penetrating the insulating film so as to extend to the semiconductor substrate, the method including: forming an impurity-doped first semiconductor layer along a wall surface which defines the depression, the first semiconductor layer including a first amorphous semiconductor region which extends along a sidewall surface defining the depression; forming, on the first semiconductor layer, a second semiconductor layer which is lower in impurity concentration than the first semiconductor layer and which is smaller in thickness than the first semiconductor layer, the second semiconductor layer including a second amorphous semiconductor region formed on the first amorphous semiconductor region; annealing the workpiece to form an epitaxial region at the bottom of the depression corresponding to crystals of the semiconductor substrate from the first semiconductor layer and the second semiconductor layer; and etching the first amorphous semiconductor region and the second amorphous semiconductor region.

According to another embodiment of the present disclosure, there is provided a processing apparatus, including: a vessel; a gas supply unit configured to supply a first gas including a semiconductor raw material gas and an impurity raw material gas, a second semiconductor raw material gas, and a third etching gas, into the vessel; a heating unit configured to heat an internal space of the vessel; and a control unit configured to control the gas supply unit and the heating unit, wherein the control unit is configured to execute: a first control operation for controlling the gas supply unit so as to supply the first gas into the vessel and for controlling the heating unit so as to heat the internal space of the vessel; after execution of the first control operation, a second control operation for controlling the gas supply unit so as to supply the second gas into the vessel and for controlling the heating unit so as to heat the internal space of the vessel; after execution of the second control operation, a third control operation for controlling the heating unit so as to heat the internal space of the vessel; and after execution of the third control operation, a fourth control operation for controlling the gas supply unit so as to supply the third gas into the vessel.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Various embodiments will now be described in detail with reference to the accompanying drawings. Throughout the drawings, identical or equivalent parts will be designated by like reference symbols. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
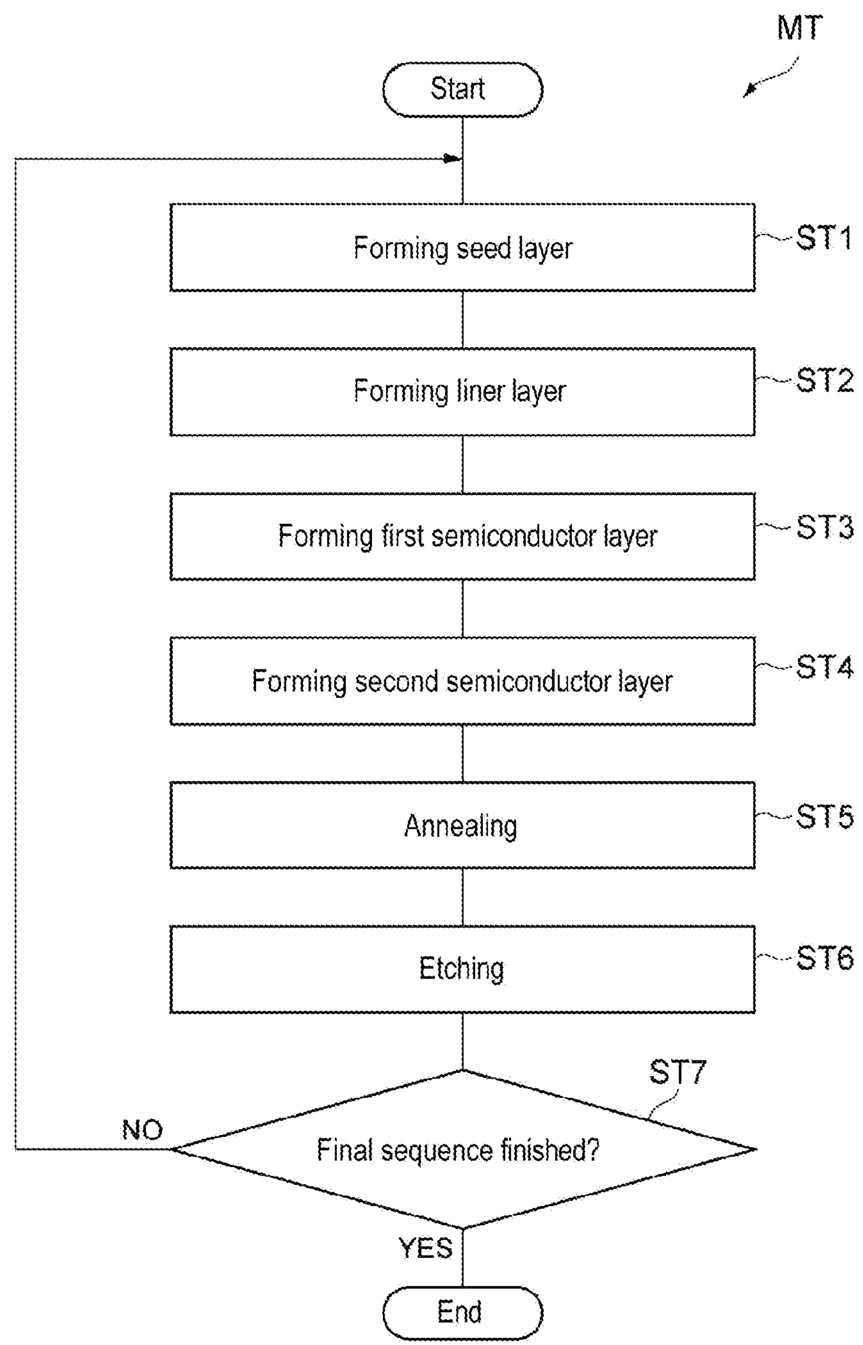
FIG. 1 is a flowchart illustrating a depression filling process according to an embodiment.

FIG. 1 is a flowchart illustrating a depression filling process, according to some embodiments. In the process MT, illustrated in FIG. 1, a semiconductor layer is formed along a wall surface of a workpiece, which defines a depression. By annealing the workpiece, an epitaxial region based on the semiconductor layer is formed on the bottom of the depression. The depression is wholly or partially filled by the epitaxial region.

Figure 2A:
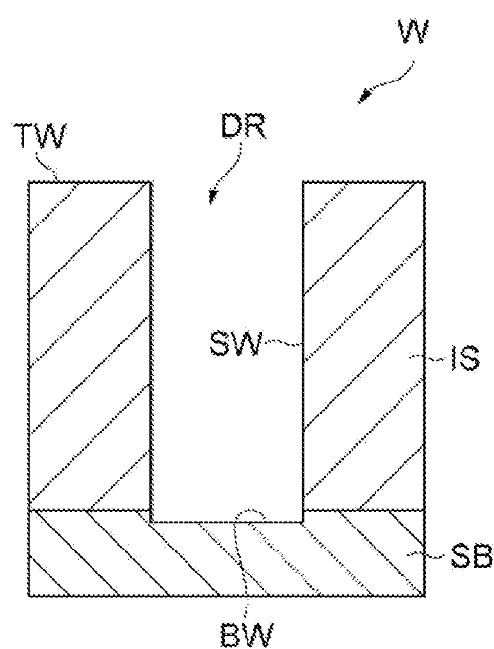
FIGS. 2A to 2C are views illustrating the states of a workpiece that has been subjected to respective steps of the process illustrated in FIG. 1.

FIGS. 2A to 2C, FIGS. 3A to 3D and FIGS. 4A and 4B are views illustrating the states of the workpiece subjected to the one step of the process illustrated in FIG. 1. In FIGS. 2A to 2C, FIGS. 3A to 3D and FIGS. 4A and 4B, partially-enlarged sectional views of the workpiece are shown. As shown in FIG. 2A, a workpiece (hereinafter referred to as a "wafer") W includes a semiconductor substrate SB and an insulating film IS. The substrate SB may be a monocrystalline semiconductor substrate or a polycrystalline semiconductor substrate, e.g., a monocrystalline silicon substrate or a polycrystalline silicon substrate. The insulating film IS is formed on the semiconductor substrate SB. The insulating film IS may be formed of, e.g., $SiO_2$ or SiN. A depression DR such as a trench or a through-hole is formed at the insulating film IS so as to extend to the semiconductor substrate SB through the insulating film IS. The depression DR can be formed, e.g., by forming a mask on the insulating film IS and etching the insulating film IS. In some embodiments, the depression DR is formed by piercing the insulating film IS and engraving the semiconductor substrate SB in the depth direction beyond an interface of the semiconductor substrate SB and the insulating film IS. This makes it possible to expose an uncontaminated surface of the semiconductor substrate SB to the depression DR. The depression DR may have a depth of, e.g., 200 nm, and a width of, e.g., 40 to 50 nm.

In the process MT, according to some embodiments, steps ST3 to ST6 are carried out with respect to the wafer W. Further, in the process MT according to some embodiments, a sequence including steps ST3 to ST6 is repeated. Step ST3 is to form a first semiconductor layer along a wall surface which defines a depression DR of the wafer W. Step ST4 is to form a second semiconductor layer. Step ST5 is to anneal the wafer W. Step ST6 is to etch an amorphous silicon region left after the annealing of step ST5. In some embodiments, the sequence may include steps ST1 and ST2 to be implemented prior to step ST3. Step ST1 is to form a seed layer. Step ST2 is to form a linear layer.

Figure 5:
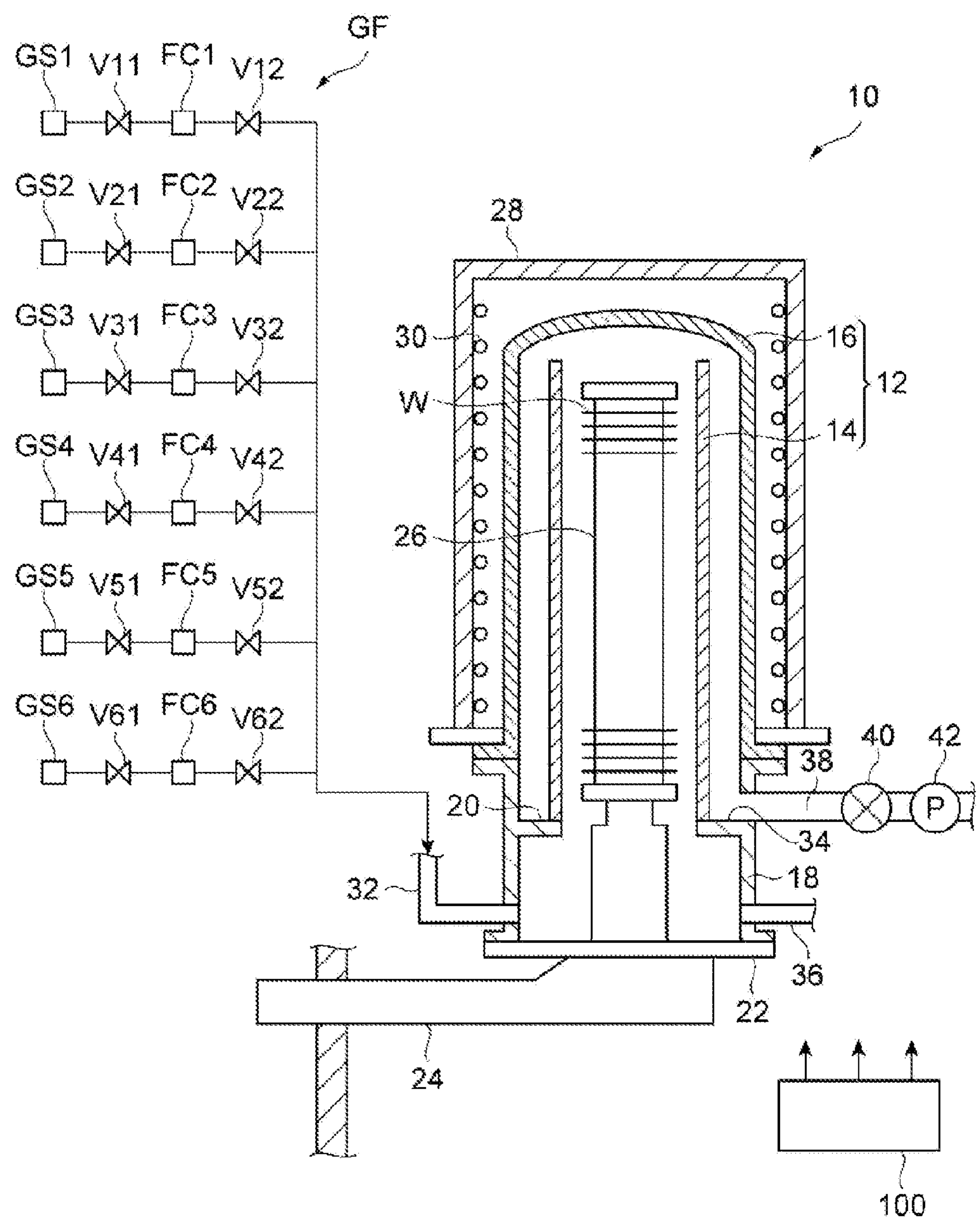
FIG. 5 is an illustrative view schematically showing a processing apparatus that can be used in implementing the process of FIG. 1, according to some embodiments.

A description will now be provided for one example of a processing apparatus that can be used in implementing steps ST1 to ST6. FIG. 5 is an illustrative view schematically showing the processing apparatus that can be used in implementing the process according to some embodiments. The processing apparatus shown in FIG. 5 can be used in implementing steps ST1 to ST6. In some embodiments, steps ST1 to ST6 may be implemented by other processing apparatuses, respectively.

The processing apparatus 10 shown in FIG. 5 includes a vessel 12. The vessel 12 is a reaction tube having a substantially cylindrical shape. The longitudinal direction of the vessel 12 is oriented in a vertical direction. The vessel 12 has a double tube structure and includes an inner tube 14 and an outer tube 16. The inner tube 14 and the outer tube 16 are made of a material superior in heat resistance and corrosion resistance, e.g., quartz.

The inner tube 14 has a substantially cylindrical shape with an upper end and a lower end. The upper and lower ends of the inner tube 14 are opened. The outer tube 16 is installed in a substantially coaxial relationship with the inner tube 14 so as to cover the inner tube 14. There is a pre-specified gap between the inner tube 14 and the outer tube 16. An upper end of the outer tube 16 is closed and a lower end of the outer tube 16 is opened.

A manifold 18 is installed below the outer tube 16. The manifold 18 is formed in a tubular shape and may be made of, e.g., stainless steel (SUS). The manifold 18 is air-tightly connected to the lower end of the outer tube 16. In the manifold 18, a support ring 20 is formed to protrude inward from the inner wall of the manifold 18. The support ring 20 supports the inner tube 14.

A lid 22 is installed below the manifold 18. The lid 22 is connected to a boat elevator 24 and can be moved up and down by the boat elevator 24. If the lid 22 is moved up by the boat elevator 24, a lower opening (namely, a throat portion) of the manifold 18 is closed. On the other hand, if the lid 22 is moved down by the boat elevator 24, the lower opening (namely, a throat portion) of the manifold 18 is opened.

A wafer boat 26 is mounted on the lid 22. The wafer boat 26 may be made of, e.g., quartz. The wafer boat 26 is configured to hold a plurality of wafers W in the vertical direction with a pre-specified gap between the respective wafers.

A heat insulating body 28 is installed around the vessel 12 so as to surround the vessel 12. Heaters (or heating units) 30 are installed at the inner wall surface of the heat insulating body 28. The heaters 30 are composed of, e.g., resistance heating elements. The interior of the vessel 12 is heated to a specified temperature by the heaters 30. Thus, the wafers W are heated to a predetermined temperature.

At least one gas introduction pipe 32 is connected to the sidewall of the manifold 18. For example, the gas introduction pipe 32 is connected to the sidewall of the manifold 18 at a position lower than the support ring 20. A gas line formed by the gas introduction pipe 32 communicates with the interior of the vessel 12.

A gas supply unit GF is connected to the gas introduction pipe 32. In some embodiments, the gas supply unit GF includes gas sources GS1, GS2, GS3, GS4, GS5 and GS6, valves V11, V12, V21, V22, V31, V32, V41, V42, V51, V52, V61 and V62, and flow rate controllers FC1, FC2, FC3, FC4, FC5 and FC6 such as mass flow controllers or the like. The gas source GS1 is connected to the gas introduction pipe 32 through the valve V11, the flow rate controller FC1 and the valve V12. The gas source GS2 is connected to the gas introduction pipe 32 through the valve V21, the flow rate controller FC2 and the valve V22. The gas source GS3 is connected to the gas introduction pipe 32 through the valve V31, the flow rate controller FC3 and the valve V32. The gas source GS4 is connected to the gas introduction pipe 32 through the valve V41, the flow rate controller FC4 and the valve V42. The gas source GS5 is connected to the gas introduction pipe 32 through the valve V51, the flow rate controller FC5 and the valve V52. The gas source GS6 is connected to the gas introduction pipe 32 through the valve V61, the flow rate controller FC6 and the valve V62.

The gas source GS1 is a source for supplying a raw material gas used in forming a seed layer at step ST1. The gas source GS1 may supply, e.g., an aminosilane-based gas. Examples of the aminosilane-based gas may include BAS (butylaminosilane), BTBAS (bis(tertiary-butylamino) silane), DMAS (dimethylaminosilane), BDMAS (bis(dimethylamino)silane), TDMAS (tri(dimethylamino) silane), DEAS (diethylaminosilane), BDEAS (bis(diethylamino)silane), DPAS (dipropylaminosilane), or DIPAS (diisopropylaminosilane). Furthermore, an aminodisilane gas may be used as the aminosilane-based gas. In some embodiments, examples of the aminosilane-based gas may include diisopropylaminodisilane ($Si_2H_5N(iPr)_2$), diisopropylaminotrisilane ($Si_3H_7N(iPr)_2$), diisopropylaminodichlorosilane ($Si_2H_4ClN(iPr)_2$), or diisopropylaminotrichlorosilane ($Si_3H_6ClN(iPr)_2$). Moreover, the gas source GS1 may be a source of a high-order silane gas such as a disilane gas, a trisilane gas, a tetrasilane gas.

The gas source GS2 is a source of a semiconductor raw material gas that can be used in forming a liner layer at step ST2, forming a first semiconductor layer at step ST3 and forming a second semiconductor layer at step ST4. If the liner layer, the first semiconductor layer and the second semiconductor layer are silicon layers, the gas source GS2 may be a source of a silicon-containing gas such as a monosilane gas, a disilane gas or the aforementioned aminosilane-based gas. If the liner layer, the first semiconductor layer and the second semiconductor layer are composed of germanium, the gas source GS2 may be a source of a germane-containing gas such as a monogermane or the like. If the liner layer, the first semiconductor layer and the second semiconductor layer are composed of silicon germanium, the gas source GS2 may be a source of a mixture of a germane-containing gas and a silicon-containing gas. In addition, the liner layer, the first semiconductor layer and the second semiconductor layer may be respectively formed by using different gases supplied from separate gas sources.

The gas source GS3 is a source of an impurity raw material gas that can be used at step ST3. Examples of the impurity may include arsenic (As), boron (B) and phosphorus (P). Examples of the impurity raw material gas may include phosphine ($PH_3$), diborane ($B_2H_6$), boron trichloride ($BCl_3$) and arsine ($AsH_3$).

The gas source GS4 is a source of an additional gas. For example, the additional gas can be used in the formation of at least one of the seed layer, the liner layer, the first semiconductor layer and the second semiconductor layer. Examples of the additional gas may include a $C_2H_4$ gas, a $N_2O$ gas, a NO gas and a $NH_3$ gas. In some embodiments, one or more of the $C_2H_4$ gas, the $N_2O$ gas, the NO gas and the $NH_3$ gas may be used as the additional gas.

The gas source GS5 is a source of an inert gas that can be used in the annealing implemented at step ST5. Examples of the inert gas may include a hydrogen gas and a nitrogen gas.

The gas source GS6 is a source of an etching gas that can be used in the etching implemented at step ST6. For the etching gas, it is possible to use a gas containing one or more of $Cl_2$, HCl, $F_2$, $Br_2$ and HBr. An arbitrary gas may be used as the etching gas if it can selectively etch an amorphous semiconductor region with respect to the insulating film IS and the epitaxial region.

As shown in FIG. 5, an exhaust port 34 through which a gas existing within the vessel 12 is exhausted, is formed at the side surface of the manifold 18. The exhaust port 34 is arranged above the support ring 20 and is in communication with the space formed between the inner tube 14 and the outer tube 16 of the vessel 12. Accordingly, an exhaust gas generated within the inner tube 14 flows toward the exhaust port 34 through the space formed between the inner tube 14 and the outer tube 16.

Further, a purge gas supply pipe 36 is connected to the manifold 18. The purge gas supply pipe 36 is connected to the manifold 18 below the exhaust port 34. The purge gas supply pipe 36 is connected to a purge gas supply source (not shown). A purge gas, e.g., a nitrogen gas, is supplied from the purge gas supply source into the vessel 12 through the purge gas supply pipe 36.

An exhaust pipe 38 is air-tightly connected to the exhaust port 34. From the upstream side of the exhaust pipe 38, a valve 40 and an exhaust unit 42 such as a vacuum pump are installed at the exhaust pipe 38. The valve 40 adjusts an opening degree of the exhaust pipe 38, thereby controlling an internal pressure of the vessel 12 at a predetermined pressure. The exhaust unit 42 discharges a gas from the vessel 12 through the exhaust pipe 38 and adjusts the internal pressure of the vessel 12. In some embodiments, a trap, a scrubber, and so forth may be installed in the exhaust pipe 38. In addition, the processing apparatus 10 may be configured to detoxify the exhaust gas discharged from the vessel 12 before the exhaust gas is exhausted out of the processing apparatus 10.

Figure 6:
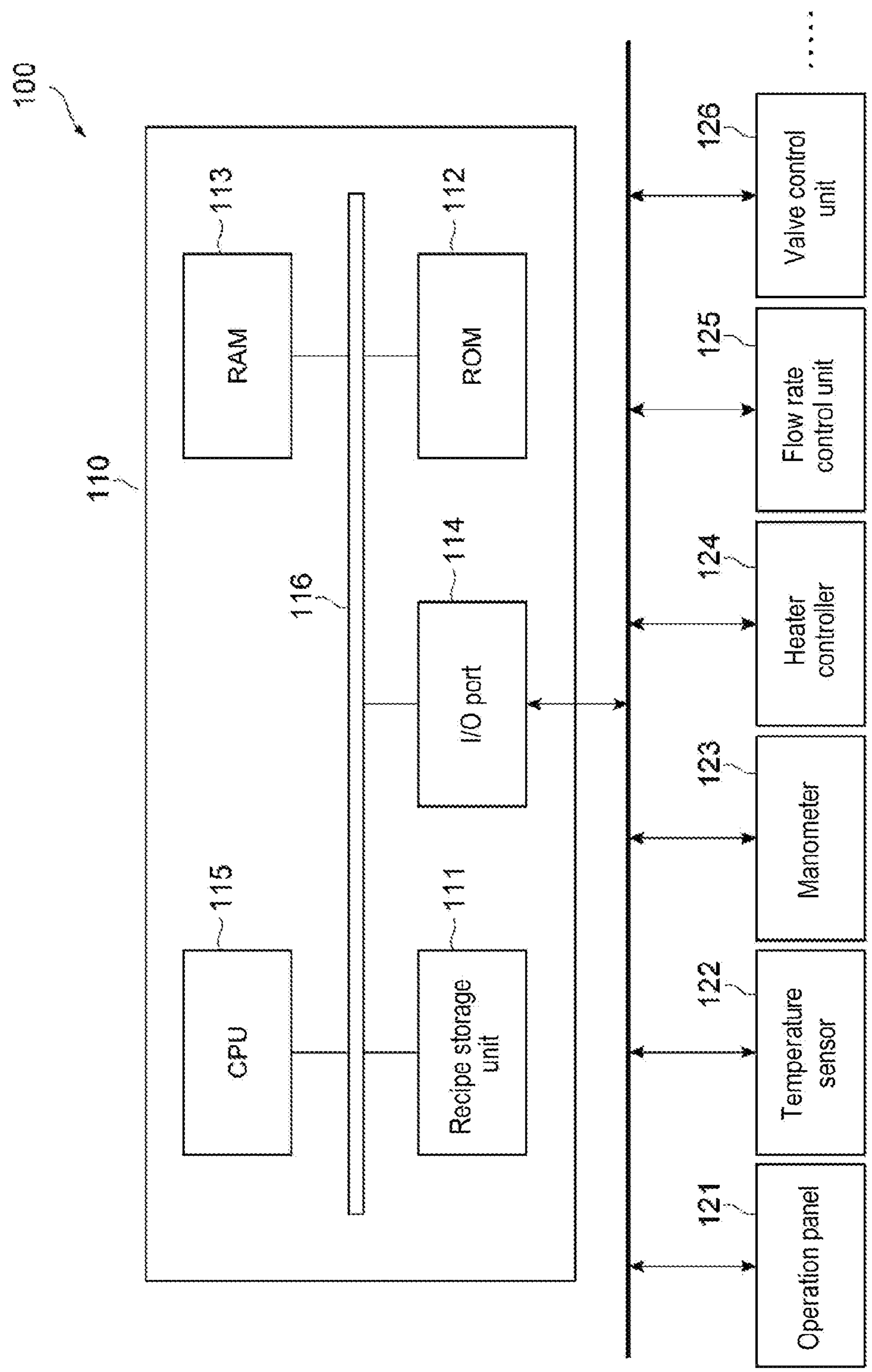
FIG. 6 is an illustrative view showing a configuration of a control unit of the processing apparatus shown in FIG. 5.

The processing apparatus 10 further includes a control unit 100 configured to control individual units of the processing apparatus 10. FIG. 6 shows the configuration of the control unit 100. As shown in FIG. 6, the control unit 100 includes a main control unit 110. An operation panel 121, a temperature sensor (group) 122, a manometer (group) 123, a heater controller 124, a flow rate control unit 125, a valve control unit 126, and so forth are connected to the main control unit 110.

The operation panel 121 includes a display screen and operation buttons and delivers an operator's operation instruction to the main control unit 110. Further, the operation panel 121 allows the display screen to display various types of information transmitted from the main control unit 110.

The temperature sensor (group) 122 measures internal temperatures of the vessel 12, the gas introduction pipe 32, the exhaust pipe 38 and the like, and notifies the measured temperature values to the main control unit 110. The manometer (group) 123 measures internal pressures of the vessel 12, the gas introduction pipe 32, the exhaust pipe 38 and the like, and notifies the measured pressure values to the main control unit 110.

The heater controller 124 is configured to individually control the heaters 30. In response to the instruction transmitted from the main control unit 110, the heater controller 124 supplies electric power to the heaters 30, thereby causing the heaters 30 to generate heat. Moreover, the heater controller 124 individually measures power consumption of the heaters 30 and notifies the measured power consumption to the main control unit 110.

The flow rate control unit 125 controls the flow rate controllers FC1 to FC6 of the gas supply unit GF such that the flow rates of the gases flowing through the gas introduction pipe 32 become equal to the flow rates instructed by the main control unit 110. Moreover, the flow rate control unit 125 measures flow rates of the gases actually flowing through the gas introduction pipe 32 and reports the measured flow rate values to the main control unit 110. The valve control unit 126 controls opening degrees of the valves arranged in the respective pipes according to the values instructed by the main control unit 110.

The main control unit 110 includes a recipe storage unit 111, a ROM 112, a RAM 113, an I/O port 114, a CPU 115, and a bus 116 which interconnects the recipe storage unit 111, the ROM 112, the RAM 113, the I/O port 114 and the CPU 115.

A setup recipe and a plurality of process recipes are stored in the recipe storage unit 111. The recipe storage unit 111 only stores the setup recipe when the processing apparatus 10 is initially manufactured. The setup recipe is executed to generate a thermal model or the like corresponding to different processing apparatuses. The process recipes are prepared for each individual process which is actually performed pursuant to the user's desire. For example, the process recipes define a variation in temperature in the respective areas, a variation in the internal pressure of the vessel 12, the start and stop timing for supplying the processing gas, the supply amount of the processing gas, and the like, from the time at which the wafers W are loaded into the vessel 12 to the time at which the processed wafers W are unloaded from the vessel 12.

The ROM 112 is formed of an EEPROM, a flash memory, a hard disk or the like. The ROM 112 is a storage medium for storing an operation program of the CPU 115. The RAM 113 serves as a work area or the like of the CPU 115.

The I/O port 114 is connected to the operation panel 121, the temperature sensor (group) 122, the manometer (group) 123, the heater controller 124, the flow rate control unit 125 and the valve control unit 126 and the like. The I/O port 114 controls the input and output of data or signals.

The CPU (Central Processing Unit) 115 is the core of the main control unit 110 and executes the control program stored in the ROM 112. In response to the instructions transmitted from the operation panel 121, the CPU 115 controls the operation of the processing apparatus 10 depending on the recipes (process recipes) stored in the recipe storage unit 111. The CPU 115 controls the temperature sensor (group) 122, the manometer (group) 123, the flow rate control unit 125, and the like to respectively measure the temperatures, pressures, flow rates, and the like within the vessel 12, the gas introduction pipe 32 and the exhaust pipe 38. Based on the measured data, the CPU 115 outputs control signals and the like to the heater controller 124, the flow rate control unit 125, the valve control unit 126 and the like and controls the respective units pursuant to the process recipes. The bus 116 transmits information between the respective units.

Hereinafter, the aforementioned process MT which can be implemented by the processing apparatus 10 configured as above will be described in more detail with reference to FIGS. 1, 2A to 2C, 3A to 3D, 4A and 4B.

Figure 2B:
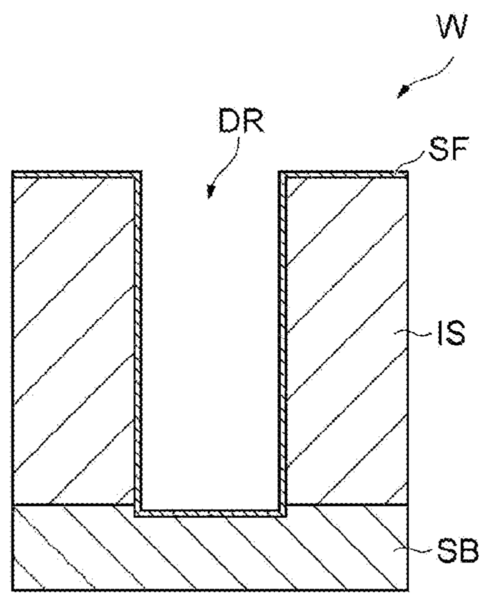

In the process MT, step ST1 is implemented. At step ST1, a seed layer SF is formed as shown in FIG. 2B. The seed layer SF is formed on a wall surface which defines a depression DR. The wall surface on which seed layer SF is formed, includes a sidewall surface SW which defines the depression DR at the lateral side and a bottom surface BW which defines the depression DR at the lower side. At step ST1, the seed layer SF is also formed on a top surface TW of the insulating film IS. The seed layer SF is formed at a thickness of, e.g., 0.1 nm so as not to close the depression DR.

At step ST1, in order to form the seed layer SF, a raw material gas such as an aminosilane-based gas or a high-order silane gas is supplied at a predetermined flow rate into the vessel 12 in which the wafers W are accommodated. The internal pressure and internal temperature of the vessel 12 are set to predetermined values, respectively. In some embodiments, at step ST1, the flow rate of the raw material gas may be set to fall within a predetermined range of, e.g., from 10 sccm to 500 sccm. Further, the internal pressure of the vessel 12 may be set to fall within a predetermined range of, e.g., from 0.1 Torr (13.33 Pa) to 10 Torr (1333 Pa). Further, the internal temperature of the vessel 12 may be set to fall within a predetermined range of, e.g., from 300 degrees C. to 600 degrees C. By forming the seed layer SF in this way, it becomes possible to reduce the surface energy at an interface between the seed layer SF and the semiconductor layer formed on the seed layer SF. This helps improve the surface flatness of the semiconductor layer formed on the seed layer SF.

When implementing the formation of the seed layer SF at step ST1 with the processing apparatus 10, the control unit 100 performs a control operation (a sixth control operation) to be described below. In this control operation, the control unit 100 controls the valve V11, the flow rate controller FC1 and the valve V12 so that the raw material gas can be supplied from the gas source GS1 into the vessel 12 at a specified flow rate. Further, the control unit 100 controls the exhaust unit 42 so that the internal pressure of the vessel 12 becomes equal to a predetermined pressure. Moreover, the control unit 100 controls the heaters 30 so that the internal temperature of the vessel 12 becomes equal to a predetermined temperature.

The seed layer SF is formed as a single layer by the aminosilane-based gas or the high-order silane gas but is not limited thereto. For example, the seed layer SF may be formed by forming a first silicon-containing layer through the adsorption or deposition of the aminosilane-based gas and then forming a second silicon-containing layer on the first silicon-containing layer through the use of the high-order silane gas.

Figure 2C:
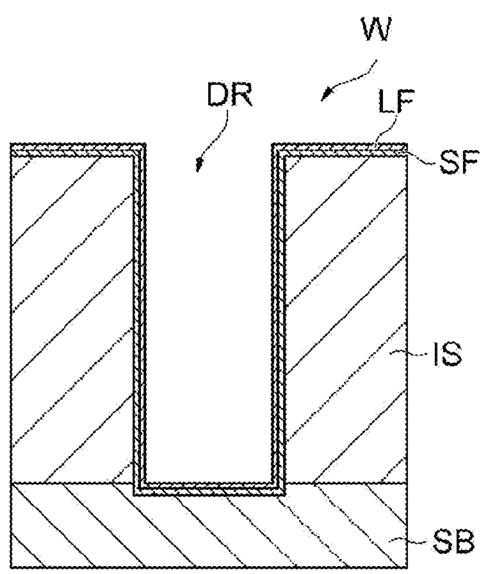

Subsequently, in the process MT, step ST2 is implemented. At step ST2, a liner layer LF is formed as shown in FIG. 2C. The liner layer LF is an undoped semiconductor layer and maybe, e.g., a silicon layer, a germanium layer or a silicon germanium layer. The liner layer LF is formed between the wall surface defining the depression DR and the first semiconductor layer. In some embodiments, the liner layer LF is formed along the sidewall surface SW, the bottom surface BW and the top surface TW. Furthermore, the liner layer LF is formed at a thickness of, e.g., 0.5 nm to 10 nm, so as not to close the depression DR. In FIG. 2C, the liner layer LF is formed on the seed layer SF. Alternatively, the liner layer LF may be directly formed at the sidewall surface SW, the bottom surface BW and the top surface TW. By forming the liner layer LF, it becomes possible to suppress occurrence of migration of the impurity contained in the first semiconductor layer at the below-mentioned annealing step (step ST5).

At step ST2, for the purpose of forming the liner layer LF, a fourth gas is supplied into the vessel which accommodates the wafer W. The fourth gas includes a semiconductor raw material gas. The semiconductor raw material gas is a silicon-containing gas such as, e.g., a monosilane gas, a disilane gas or the aforementioned aminosilane-based gas. The semiconductor raw material gas may be a germane-containing gas. Alternatively, the semiconductor raw material gas may be a mixture of the monosilane gas, the disilane gas or the aforementioned aminosilane-based gas and the germane-containing gas. The fourth gas is supplied into the vessel at a flow rate of, e.g., 50 sccm to 5000 sccm. At step ST2, in order to form the liner layer LF, the internal pressure of the vessel is set to fall within a range of, e.g., 0.1 Torr (13.33 Pa) to 10 Torr (1333 Pa). In addition, at step ST2, the internal temperature of the vessel is set to fall within a range of, e.g., 300 degrees C. to 600 degrees C.

When implementing the formation of the liner layer LF at step ST2 with the processing apparatus 10, the control unit 100 performs a control operation (a fifth control operation) to be described below. In this control operation, the control unit 100 controls the valve V21, the flow rate controller FC2 and the valve V22 so that the fourth gas can be supplied from the gas source GS2 into the vessel 12 at a specified flow rate. Further, the control unit 100 controls the exhaust unit 42 so that the internal pressure of the vessel 12 becomes equal to a predetermined pressure. Moreover, the control unit 100 controls the heaters 30 so that the internal temperature of the vessel 12 becomes equal to a predetermined temperature.

Figure 3A:
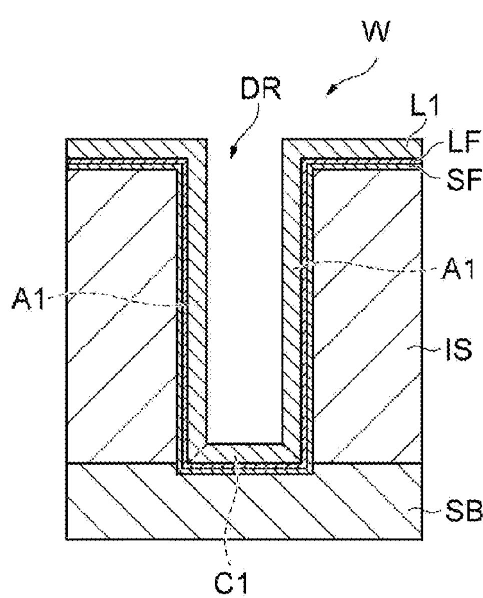
FIGS. 3A to 3D are views illustrating the states of a workpiece that has been subjected to one step of the process illustrated in FIG. 1.

Subsequently, in the process MT, step ST3 is implemented. At step ST3, a first semiconductor layer L1 containing an impurity is formed as shown in FIG. 3A. The first semiconductor layer L1 may be, e.g., a silicon layer, a germanium layer or a silicon germanium layer. The impurity contained in the first semiconductor layer L1 may be, e.g., arsenic (As), boron (B) or P (phosphorus). The first semiconductor layer L1 is formed along the wall surface defining the depression DR, so as not to close the depression DR. For example, the first semiconductor layer L1 is formed along the sidewall surface SW, the bottom surface BW and the top surface TW. In some embodiments, the first semiconductor layer L1 is formed on the liner layer LF. In another embodiment, the first semiconductor layer L1 may be directly formed on the sidewall surface SW, the bottom surface BW and the top surface TW. The thickness of the first semiconductor layer L1 is set at, e.g., 1 nm to 50 nm.

At step ST3, in order to form the first semiconductor layer L1, a first gas is supplied into the vessel which accommodates the wafer W. At step ST3, the internal pressure of the vessel is set at a predetermined pressure and the internal temperature of the vessel set at a predetermined temperature. The first gas includes a semiconductor raw material gas and an impurity raw material gas. The semiconductor raw material gas is, e.g., a monosilane gas, a disilane gas or the aforementioned aminosilane-based gas. The semiconductor raw material gas may be a germane-containing gas. Alternatively, the semiconductor raw material gas may be a mixture of the monosilane gas, the disilane gas or the aforementioned aminosilane-based gas and the germane-containing gas. The impurity raw material gas is, e.g., phosphine ($PH_3$), diborane ($B_2H_6$), boron trichloride ($BCl_3$) or arsine ($AsH_3$). At step ST3, the semiconductor raw material gas is supplied into the vessel at a flow rate of, e.g., 50 sccm to 5000 sccm. The impurity raw material gas is supplied into the vessel at a flow rate of, e.g., 5 sccm to 1000 sccm. At step ST3, the internal pressure of the vessel is set to fall within a range of, e.g., 0.1 Torr (13.33 Pa) to 10 Torr (1333 Pa), and the internal temperature of the vessel is set to fall within a range of, e.g., 300 degrees C. to 700 degrees C.

When implementing step ST3 with the processing apparatus 10, the control unit 100 performs a control operation (a first control operation) to be described below. In this control operation, the control unit 100 controls the valve V21, the flow rate controller FC2 and the valve V22 so that the semiconductor raw material gas can be supplied from the gas source GS2 into the vessel 12 at a specified flow rate. Further, the control unit 100 controls the valve V31, the flow rate controller FC3 and the valve V32 so that the impurity raw material gas can be supplied from the gas source GS3 into the vessel 12 at a specified flow rate. The control unit 100 controls the exhaust unit 42 so that the internal pressure of the vessel 12 becomes equal to a predetermined pressure. Moreover, the control unit 100 controls the heaters 30 so that the internal temperature of the vessel 12 becomes equal to a predetermined temperature.

The first semiconductor layer L1 formed at step ST3 includes a first amorphous semiconductor region A1 and a first crystal region C1. The first crystal region C1 is a region which extends along the crystal plane of the semiconductor substrate SB defining the depression DR. The first crystal region C1 has a crystal structure which extends along the crystal plane of the semiconductor substrate SB. The first amorphous semiconductor region A1 is a region which extends along the sidewall surface SW defining the depression DR. The first amorphous semiconductor region A1 further extends along the top surface TW. In the state available after finishing step ST3, as indicated by dot lines in FIG. 3A, the first amorphous semiconductor region A1 provides crystal surfaces inclined at an angle of about 45 degrees from the opposite side portions of the top surface of the first amorphous semiconductor region A1.

Figure 3B:
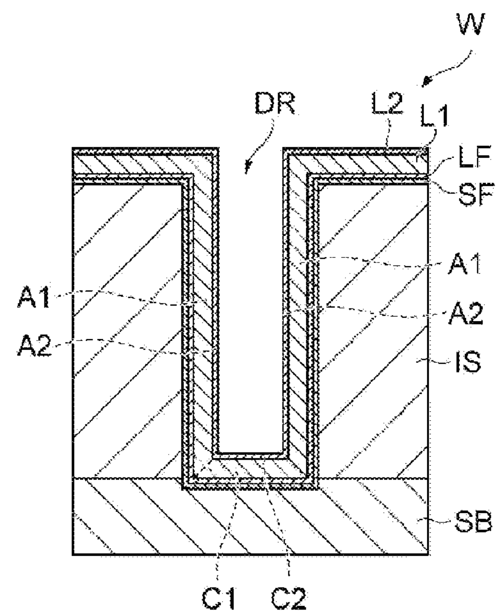

Subsequently, in the process MT, step ST4 is implemented. At step ST4, a second semiconductor layer L2 is formed as shown in FIG. 3B. The second semiconductor layer L2 has a thickness smaller than that of the first semiconductor layer L1 and has an impurity concentration lower than that of the first semiconductor layer L1. In some embodiments, the second semiconductor layer L2 is an undoped semiconductor layer. The second semiconductor layer L2 may contain an impurity at an arbitrary concentration as long as an amorphous semiconductor region is selectively etched with respect to a second portion of an epitaxial region formed from the second semiconductor layer L2 as will be described later.

The second semiconductor layer L2 may be, e.g., a silicon layer, a germanium layer or a silicon germanium layer. If the second semiconductor layer L2 contains an impurity, the impurity may be, e.g., arsenic (As), boron (B) or P (phosphorus). The second semiconductor layer L2 is formed on the first semiconductor layer L1 so as not to close the depression DR. The thickness of the second semiconductor layer L2 is set at, e.g., 1 nm to 50 nm.

At step ST4, in order to form the second semiconductor layer L2, a second gas is supplied into the vessel which accommodates the wafer W. At step ST4, the internal pressure of the vessel is set at a predetermined pressure and the internal temperature of the vessel set at a predetermined temperature. The second gas includes a semiconductor raw material gas. In some embodiments, the second gas includes an impurity raw material gas. The semiconductor raw material gas is, e.g., a monosilane gas, a disilane gas or the aforementioned aminosilane-based gas. The semiconductor raw material gas may be a germane-containing gas. Alternatively, the semiconductor raw material gas may be a mixture of the monosilane gas, the disilane gas or the aforementioned aminosilane-based gas and the germane-containing gas. The impurity raw material gas is, e.g., phosphine ($PH_3$), diborane ($B_2H_6$), boron trichloride ($BCl_3$) or arsine ($AsH_3$). At step ST4, the semiconductor raw material gas is supplied into the vessel at a flow rate of, e.g., 50 sccm to 5000 sccm. At step ST4, the internal pressure of the vessel is set to fall within a range of, e.g., 0.1 Torr (13.33 Pa) to 10 Torr (1333 Pa), and the internal temperature of the vessel is set to fall within a range of, e.g., 300 degrees C. to 700 degrees C. If the second semiconductor layer L2 contains an impurity, the impurity raw material gas is supplied into the vessel at a flow rate of, e.g., 1 sccm to 1000 sccm.

When implementing step ST4 with the processing apparatus 10, the control unit 100 performs a control operation (a second control operation) to be described below. In this control operation, the control unit 100 controls the valve V21, the flow rate controller FC2 and the valve V22 so that the semiconductor raw material gas can be supplied from the gas source GS2 into the vessel 12 at a specified flow rate. The control unit 100 controls the exhaust unit 42 so that the internal pressure of the vessel 12 becomes equal to a predetermined pressure. The control unit 100 controls the heaters 30 so that the internal temperature of the vessel 12 becomes equal to a predetermined temperature. If the second semiconductor layer L2 contains an impurity, the control unit 100 controls the valve V31, the flow rate controller FC3 and the valve V32 so that the impurity raw material gas can be supplied from the gas source GS3 into the vessel 12 at a specified flow rate.

The second semiconductor layer L2 formed at step ST4 includes a second amorphous semiconductor region A2 and a second crystal region C2. The second crystal region C2 is a region which extends along the crystal plane of the semiconductor substrate SB defining the depression DR. The second crystal region C2 has a crystal structure which extends along the crystal plane of the semiconductor substrate SB. The second amorphous semiconductor region A2 is a region which extends along the sidewall surface SW defining the depression DR. The second amorphous semiconductor region A2 further extends along the top surface TW. In the state available after finishing step ST4, just like the first amorphous semiconductor region A1, as indicated by the dot lines in FIG. 3B, the second amorphous semiconductor region A2 provides crystal surfaces inclined at an angle of about 45 degrees from the opposite side portions of the top surface of the second amorphous semiconductor region A2.

Figure 3C:
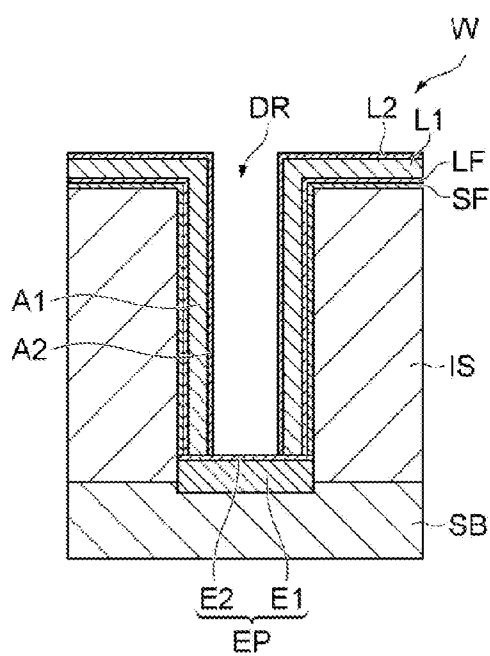
Figure 3D:
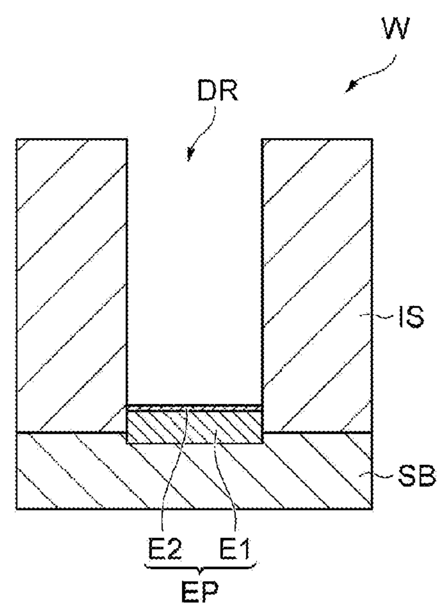

Subsequently, in the process MT, step ST5 is implemented. At step ST5, the wafer W is annealed. In the annealing implemented at step ST5, as shown in FIG. 3C, an epitaxial region EP is formed at the bottom of the depression DR by a solid-phase epitaxial growth. The epitaxial region EP includes a first portion E1 and a second portion E2. In the annealing implemented at ST5, the first amorphous semiconductor region A1 and the second amorphous semiconductor region A2 are partially crystallized so that the first crystal region C1 and the second crystal region C2 can be widened in the transverse direction. Thus, the second portion E2 is formed so as to cover the first portion E1 formed from the first semiconductor layer L1. That is to say, the first portion E1 is capped by the second portion E2. The thickness of the seed layer SF and the thickness of the liner layer LF are smaller than the thickness of the first semiconductor layer L1 and the thickness of the second semiconductor layer L2. Therefore, the thickness of the seed layer SF and the portion of the epitaxial region EP formed by a solid-phase epitaxial growth of the liner layer LF are quite small. Accordingly, only the first portion E1 and the second portion E2 are illustrated in FIG. 3C.

At step ST5, the internal temperature of the vessel which accommodates the wafer W is set at a predetermined temperature. For example, the internal temperature of the vessel is set to fall within a range of 300 degrees C. to 600 degrees C. In one example, the internal temperature of the vessel is set at 550 degrees C. At step ST5, the internal pressure of the vessel is set at a predetermined pressure. For example, at step ST5, the internal pressure of the vessel is set to fall within a range of $1\times10^{-10}$ Torr ($1.333\times10^{-7}$ Pa) to 1 Torr (133.3 Pa). In one example, the internal pressure of the vessel is set at $1\times10^{-6}$ Torr ($1.333\times10^{-3}$ Pa). At step ST5, the wafer W is annealed for, e.g., 5 hours. At step ST5, an inert gas such as a hydrogen gas or a nitrogen gas may be supplied into the vessel.

When implementing step ST5 with the processing apparatus 10, the control unit 100 performs a control operation (a third control operation) to be described below. In this control operation, the control unit 100 controls the exhaust unit 42 so that the internal pressure of the vessel 12 becomes equal to a predetermined pressure. The control unit 100 controls the heaters 30 so that the internal temperature of the vessel 12 becomes equal to a predetermined temperature. If an inert gas is used, the control unit 100 controls the valve V51, the flow rate controller FC5 and the valve V52 so that the inert gas can be supplied from the gas source GS5 into the vessel 12 at a specified flow rate.

Subsequently, in the process MT, step ST6 is implemented. At step ST6, the residual portions of the first amorphous semiconductor region A1 and the second amorphous semiconductor region A2 which remain without forming the epitaxial region EP at step ST5 are etched. Furthermore, at step ST6, the residual portions of the seed layer SF and the liner layer LF which do not form the epitaxial region EP are etched.

At step ST6, a third gas is supplied at a specified flow rate into the vessel which accommodates the wafer W. The third gas may contain one or more of $Cl_2$, HCl, $F_2$, $Br_2$ and HBr. The flow rate of the third gas is, e.g., 10 sccm to 5000 sccm. At step ST6, the internal pressure of the vessel is set at a predetermined pressure and the internal temperature of the vessel is set at a predetermined temperature. At step ST6, the internal pressure of the vessel may be set to fall within a range of, e.g., $1\times10^{-10}$ Torr ($1.333\times10^{-7}$ Pa) to 100 Torr ($133.3\times10^{2}$ Pa). At step ST6, the internal temperature of the vessel may be set to fall within a range of, e.g., 200 degrees C. to 700 degrees C. In one example, at step ST6, the internal pressure and internal temperature of the vessel may be set at $4\times10^{-2}$ Torr (5.333 Pa) and 550 degrees C.

The etching rate of the first amorphous semiconductor region A1, the second amorphous semiconductor region A2, the seed layer SF and the liner layer LF etched by a sixth gas is higher than the etching rate of the epitaxial region EP etched by the sixth gas. Since the first portion E1 contains an impurity, the etching rate of the first portion E1 etched by the sixth gas is relatively closer to the etching rate of the first amorphous semiconductor region A1, the second amorphous semiconductor region A2, the seed layer SF and the liner layer LF etched by the sixth gas. However, the first portion E1 is lower in impurity concentration or capped by the undoped second portion E2. This makes it possible to etch the first amorphous semiconductor region A1, the second amorphous semiconductor region A2, the seed layer SF and the liner layer LF while leaving the epitaxial region EP.

When implementing step ST6 with the processing apparatus 10, the control unit 100 performs a control operation (a fourth control operation) to be described below. In this control operation, the control unit 100 controls the valve V61, the flow rate controller FC6 and the valve V62 so that the third gas can be supplied from the gas source GS6 into the vessel 12 at a specified flow rate. The control unit 100 controls the exhaust unit 42 so that the internal pressure of the vessel 12 becomes equal to a predetermined pressure. The control unit 100 controls the heaters 30 so that the internal temperature of the vessel 12 becomes equal to a predetermined temperature.

Subsequently, in the process MT, it is determined at step ST7 whether the final sequence has been finished. That is to say, it is determined whether one or more sequences including steps ST1 to ST6 has been finished. In the case where the final sequence has been finished, the process MT is terminated. In the case where the final sequence has not been finished, the sequence including steps ST1 to ST6 is repeated.

Figure 4A:
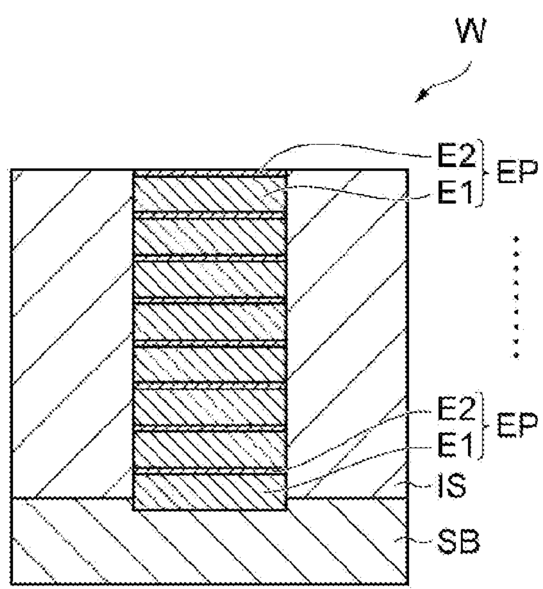
FIGS. 4A to 4B are views illustrating the states of a workpiece that has been subjected to one step of the process illustrated in FIG. 1.
Figure 4B:
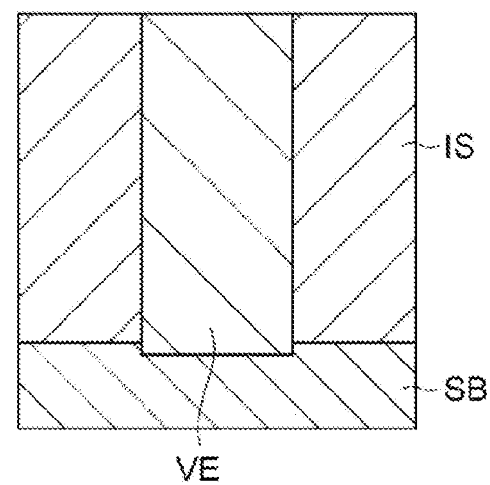

If one or more sequences of the process MT is finished, as shown in FIG. 4A, the depression DR is filled by one or more epitaxial region EP. In order to diffuse the impurity of the first portion E1, additional annealing is implemented with respect to the wafer W. Thus, as shown in FIG. 4B, an epitaxial region VE containing an impurity is formed and the depression DR is filled by the epitaxial region VE. The depression DR need not be completely filled by the epitaxial region. The depression DR may be filled by the epitaxial region up to the depth-direction intermediate portion of the depression DR, with the remaining portion of the depression DR filled by a metallic material.

According to the process MT described above, the depression DR can be filled by the epitaxial region while suppressing the generation of cavities. Furthermore, the crystal quality of the first crystal region C1 and the second crystal region C2 can be improved by the annealing of step ST5. This makes it possible to improve the film quality of the epitaxial region. It is therefore possible to reduce the contact resistance between the epitaxial region and the semiconductor substrate SB. By virtue of the annealing of step ST5, the first portion E1 containing an impurity is capped by the second portion E2. It is therefore possible to prevent the first portion E1 from being removed by the etching of step ST6.

While different embodiments have been described above, the present disclosure is not limited to the aforementioned embodiments but may be modified in many different forms. For example, at steps ST1, ST2, ST3 and ST4, an additional gas including one or more of a $C_2H_4$ gas, an $N_2O$ gas, an NO gas and an $NH_3$ gas may be further supplied into the vessel. In the case where the additional gas is used, the control unit 100 may control the valve V41, the flow rate controller FC4 and the valve V42 so that the additional gas can be supplied from the gas source GS4 into the vessel 12 at a specified flow rate. By using the additional gas, it is possible to suppress the crystallization of the semiconductor layer in a region where an amorphous semiconductor would be grown. It is also possible to reduce the grain size within the semiconductor layer.

According to the present disclosure, it is possible to provide a depression filling method and a processing apparatus to suppress the generation of cavities when filling a depression.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A depression filling method for filling a depression of a workpiece including a semiconductor substrate and an insulating film formed on the semiconductor substrate, the depression penetrating the insulating film so as to extend to the semiconductor substrate, the method comprising:

forming a first semiconductor layer doped with an impurity along a wall surface which defines the depression, the first semiconductor layer including a first amorphous semiconductor region which extends along a sidewall surface defining the depression;

forming, on the first semiconductor layer, a second semiconductor layer which is lower in impurity concentration than the first semiconductor layer and which is smaller in thickness than the first semiconductor layer, the second semiconductor layer including a second amorphous semiconductor region formed on the first amorphous semiconductor region;

annealing the workpiece to form an epitaxial region at the bottom of the depression corresponding to crystals of the semiconductor substrate from the first semiconductor layer and the second semiconductor layer; and etching the first amorphous semiconductor region and the second amorphous semiconductor region, wherein a sequence which includes forming a first semiconductor layer, forming a second semiconductor layer, annealing the workpiece, and etching the first amorphous semiconductor region and the second amorphous semiconductor region, is repeated.

2. The method of claim 1, wherein the second semiconductor layer is an undoped semiconductor layer.

3. The method of claim 1, further comprising:

forming a liner layer prior to forming the first semiconductor layer, wherein the liner layer is an undoped semiconductor layer and includes a third amorphous semiconductor region along the sidewall surface, and wherein the first semiconductor layer is formed on the liner layer.

4. The method of claim 3, wherein the first semiconductor layer, the second semiconductor layer and the liner layer are made of silicon, and further comprising:

forming a seed layer with an aminosilane-based gas or a high-order silane gas prior to forming the liner layer, wherein the seed layer is formed on the wall surface and the liner layer is formed on the seed layer.

* * * * *